(12) United States Patent
Miyata et al.

(10) Patent No.: US 12,087,783 B2
(45) Date of Patent: Sep. 10, 2024

(54) SPECTRAL ELEMENT ARRAY, IMAGE SENSOR AND IMAGE APPARATUS

(71) Applicant: Nippon Telegraph and Telephone Corporation, Tokyo (JP)

(72) Inventors: Masashi Miyata, Musashino (JP); Mitsumasa Nakajima, Musashino (JP); Toshikazu Hashimoto, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/766,472

(22) PCT Filed: Oct. 9, 2019

(86) PCT No.: PCT/JP2019/039907
§ 371 (c)(1),
(2) Date: Apr. 4, 2022

(87) PCT Pub. No.: WO2021/070305
PCT Pub. Date: Apr. 15, 2021

(65) Prior Publication Data
US 2023/0096263 A1    Mar. 30, 2023

(51) Int. Cl.
*H01L 27/146* (2006.01)
*G02B 3/00* (2006.01)
(Continued)

(52) U.S. Cl.
CPC ...... *H01L 27/14603* (2013.01); *G02B 3/0056* (2013.01); *G02B 5/201* (2013.01);
(Continued)

(58) Field of Classification Search
CPC ......... H01L 27/14621; H01L 27/14625; H01L 27/14603; G02B 7/1006
See application file for complete search history.

(56) References Cited

U.S. PATENT DOCUMENTS

2003/0156210 A1* 8/2003 Wako ............... G01J 3/2823
348/273
2010/0176473 A1    7/2010 Nishiwaki
(Continued)

FOREIGN PATENT DOCUMENTS

JP    2003-243640 A    8/2003
JP    2010-178133 A    8/2010
(Continued)

OTHER PUBLICATIONS

Seiji Nishiwaki, et al., *Efficient Colour Splitters for High-Pixel-Density Image Sensors*, Nature Photonics, vol. 7, Mar. 2013, pp. 240-246.
(Continued)

*Primary Examiner* — Thanh Luu
(74) *Attorney, Agent, or Firm* — Workman Nydegger

(57) ABSTRACT

An image sensor of the present disclosure includes a two-dimensional pixel array in which a plurality of pixels including photoelectric conversion elements are arranged in the form of an array on a substrate, a transparent layer formed on the two-dimensional pixel array, and a two-dimensional spectroscopic element array in which a plurality of spectroscopic elements are arranged in the form of an array inside or on the transparent layer. Each spectroscopic element includes a plurality of microstructures made of a material having a higher refractive index than a refractive index of the transparent layer. The plurality of microstructures have a microstructure pattern. Each of the spectroscopic elements splits incident light into first to fourth deflected lights, which have different transmission directions, according to the wavelength region. A first to fourth pixels, which are adjacent to each other and are located directly below each of the spectroscopic elements, respectively detect the first to fourth deflected lights.

10 Claims, 11 Drawing Sheets

(51) Int. Cl.
*G02B 5/20* (2006.01)
*G02B 27/10* (2006.01)
(52) U.S. Cl.
CPC .... *G02B 27/1006* (2013.01); *H01L 27/14621* (2013.01); *H01L 27/14627* (2013.01)

(56) References Cited

U.S. PATENT DOCUMENTS

| | | |
|---|---|---|
| 2010/0200730 A1 | 8/2010 | Yukawa |
| 2014/0333796 A1 | 11/2014 | Nishiwaki et al. |
| 2016/0006995 A1* | 1/2016 | Yun .................... H01L 27/14621 348/336 |
| 2018/0164154 A1* | 6/2018 | Roh .................... G02B 27/1013 |

FOREIGN PATENT DOCUMENTS

| | | |
|---|---|---|
| JP | 2014-138142 A | 7/2014 |
| KR | 20100047862 A | 6/2010 |

OTHER PUBLICATIONS

Masashi Miyata, et al., *High-Sensitivity Color Imaging Using Pixel-Scale Color Splitters Based on Dielectric Metasurfaces*, ACS Photonics, Mar. 2019, pp. 1442-1450.
David Sell, et al., *Periodic Dielectric Metasurfaces with High-Efficiency, Multiwavelength Functionalities*, Advanced Optical Materials, vol. 5, 2017, 1700645, pp. 1-7.

\* cited by examiner (a)

(b)

SPECTRAL ELEMENT ARRAY, IMAGE SENSOR AND IMAGE APPARATUS

TECHNICAL FIELD

The present invention relates to a spectroscopic element array, an image sensor, and an image capture apparatus including an image sensor.

BACKGROUND ART

In general, in an image sensor including a photoelectric conversion element such as a CCD (Charge Coupled Device) sensor or a CMOS (Complementary Metal Oxide Semiconductor) sensor, in order to acquire color information of an image capture target, it is necessary to perform color splitting of incident light in each pixel including the photoelectric conversion element.

FIG. 1 shows a cross-sectional view of a general color image sensor. In a conventional color image sensor 100, photoelectric conversion elements 102 are arranged on electrical wiring 112, and color-reduction-type color filters 104 made of an organic material or an inorganic material are arranged opposing each pixel including a photoelectric conversion element 102. Microlenses 103 are arranged on the color filters 104. When light enters from the microlens 103, the color filter 104 is used to allow only light of a desired wavelength band to pass through, and to absorb or reflect light of an unnecessary wavelength band, and thereby signals are acquired from three photoelectric conversion elements 102 corresponding to red (R), green (G), and blue (B) for each pixel, whereby a color two-dimensional image can be generated.

However, in a general color image sensor 100 such as that described above, in the case of incident light in which RGB has a ratio of 1:1:1, there is a problem in that the total amount of light after passing through the color filter 104 is inevitably reduced to about one-third. The remaining lost light is loss resulting from absorption or reflection by the color filter 104 and cannot be used to form the image. Accordingly, the light utilization efficiency of the incident light is about 30% at most, and the sensitivity of the image sensor is greatly limited. In recent years, in which pixels have become smaller (image resolution has increased), the amount of light received by one pixel has inevitably decreased, and it is desired that the above-described limitation on the sensitivity of the image sensor is reduced.

As an approach for reducing the limitation on the sensitivity of the image sensor, it has been proposed that a color image sensor is formed using spectroscopic elements such as prisms or dichroic mirrors that can branch incident light according to the wavelength band, instead of the color filters 104. In principle, such an approach can greatly reduce the loss of incident light, and therefore the light utilization efficiency can be significantly improved compared to the case where the color filters 104 are used. However, in recent years, in which pixels have become smaller, it is difficult to integrate spectroscopic elements such as prisms and dichroic mirrors on photoelectric conversion elements while maintaining their functions and characteristics.

In view of this, in recent years, it has been proposed that a color image sensor is formed using spectroscopic elements having microstructures that are relatively easy to integrate on photoelectric conversion elements. NPL 1 proposes a method of improving light utilization efficiency by eliminating light loss in color splitting in principle by using two types of microstructures capable of splitting incident light into two wavelength regions.

FIG. 2(a) shows a top view of a color image sensor 200 proposed in NPL 1, FIG. 2(b) shows a cross-sectional view thereof taken along line IIb-IIb, and FIG. 2(c) shows a cross-sectional view thereof taken along line IIc-IIc. As shown in the drawings, in the color image sensor 200, the incident light is split into light that goes straight and light that is deflected to the left and right depending on the wavelength region by micro beam structures 206-1 and 206-2, which are arranged corresponding to pixels (photoelectric conversion elements 102) instead of the color filters 104. This is because the phase delay effect felt by the incident light in and around the micro beam structures is significantly different in one wavelength region and almost equal in another wavelength region. Accordingly, by alternatingly arranging two types of micro beam structures 206-1 and 206-2, which have different structural thicknesses, in each row on a two-dimensional pixel array, four photoelectric conversion elements 102 that are adjacent to each other can receive light having different wavelengths. As a result, a color image can be generated by performing signal processing using matrix calculation on the photoelectric conversion signal output from each photoelectric conversion element 102 and reproducing the color information.

Also, NPL 2 proposes a method of improving light utilization efficiency by arranging a binary microstructure that has a constant thickness and can split incident light into three wavelength regions on a pixel (photoelectric conversion element 102).

FIG. 3(a) shows a top view of a color image sensor 300 having micro spectroscopic elements 306 proposed in NPL 2, and FIG. 3(b) shows a cross-sectional view thereof taken along line IIIb-IIIb. By using the color image sensor 300 of NPL 2, a color image can be generated through color information reconfiguration performed using signal processing, similarly to the case of using the color image sensor 200 of NPL 1. Furthermore, the light utilization efficiency of the color image sensor 300 of NPL 2 exceeds the light utilization efficiency of the color image sensor 200 of NPL 1. Also, the color image sensor 200 of NPL 2 is advantageous in that there is no polarization dependence, which was a problem in the color image sensor 200 of NPL 1, and in that it is easy to manufacture because it has a binary structure.

CITATION LIST

Non-Patent Literature

[NPL 1] Seiji Nishiwaki, Tatsuya Nakamura, Masao Hiramoto, Toshiya Fujii and Masa-aki Suzuki, "Efficient colour splitters for high-pixel-density image sensors," Nature Photonics, Vol. 7, March 2013, pp. 240-246

[NPL 2] Masashi Miyata, Mitsumasa Nakajima, Toshikazu Hashimoto, "High-Sensitivity Color Imaging Using Pixel-Scale Color Splitters Based on Dielectric Metasurfaces," ACS Photonics, March 2019, pp. 1442-1450

[NPL 3] David Sell, Jianji Yang, Sage Doshay, Jonathan A. Fan, "Periodic Dielectric Metasurfaces with High-Efficiency, Multiwavelength Functionalities," Advanced Optical Materials, Vol. 5, 2017, 1700645

SUMMARY OF THE INVENTION

NPL 1 and NPL 2 propose color reconfiguration methods using signal processing as methods for generating a color image. However, the techniques disclosed in NPL 1 and NPL 2 have problems in terms of practicality. In these color image generation methods, there is concern that a color error (noise) resulting from this signal processing will occur, and there is a risk that the signal-to-noise ratio (SN ratio) of the image will deteriorate. Accordingly, even if the light utilization efficiency, that is, the amount of light received by the sensor, increases due to the spectroscopic elements, there is a risk that the SN ratio of the captured image will not be improved due to the addition of new noise resulting from signal processing, and there is a risk that the substantial sensitivity will not be improved. Furthermore, since signal processing time is newly required, there is concern about a decrease in the time resolution of image capture. Note that, as disclosed in NPL 2, although a mode is conceivable in which color information is directly acquired based on the signal strength without using signal processing by making the shape of the microlens, which is usually a perfect circle, into an ellipse, making the shape of the pixel, which is usually a square, into a rectangle, or the like, this mode is not feasible since there is concern that changing the shape of the lens or pixel will not be compatible with the existing production process, subsequent processing, pixel arrangement, and the like, and there is a risk that it will disturb the uniformity of the spatial resolution of the image. Furthermore, the spectroscopic elements disclosed in NPL 1 and NPL 2 are both elements that color-split incident light along only one axial direction on the pixel array. Accordingly, the influence of optical crosstalk between pixels is significantly different on the color splitting axis and the axis orthogonal to the color splitting axis. As a result, there is concern that the generated color images will have different substantial spatial resolutions on the two axes orthogonal to each other.

The present disclosure has been made in view of the above problems, and an object thereof is to provide an image sensor and an image capture apparatus that have a high sensitivity and are capable of generating an image having a uniform spatial resolution without using color reconfiguration through signal processing.

In order to solve the above-described problem, an image sensor according to one embodiment of the present invention includes: a two-dimensional pixel array in which a plurality of pixels including photoelectric conversion elements are arranged in the form of an array on a substrate; a transparent layer formed on the two-dimensional pixel array; and a two-dimensional spectroscopic element array in which a plurality of spectroscopic elements are arranged in the form of an array inside or on the transparent layer, in which each of the spectroscopic elements includes a plurality of microstructures made of a material having a refractive index that is higher than a refractive index of the transparent layer, the plurality of microstructures have a microstructure pattern, each of the spectroscopic elements splits incident light in two-dimensional directions, and the plurality of pixels detect the light split in the two-dimensional directions. In one embodiment, in the above-described image sensor, each of the spectroscopic elements splits the incident light into first deflected light, second deflected light, third deflected light, and fourth deflected light that each have a different transmission direction according to a wavelength region, and a first pixel, a second pixel, a third pixel, and a fourth pixel that are adjacent to each other and are located below each of the spectroscopic elements respectively detect the first deflected light, the second deflected light, the third deflected light, and the fourth deflected light.

According to one embodiment of the present invention, by using a micro spectroscopic element capable of splitting incident light into a plurality of wavelength regions along directions of two axes of a plane, it is possible to realize an image sensor and an image capture apparatus that have a high sensitivity and are capable of generating an image having a uniform spatial resolution without using color reconfiguration through signal processing. Also, since the image sensor according to one embodiment of the present invention is consistent with the Bayer arrangement, which is a widely-used pixel arrangement, it is possible to achieve an increase in sensitivity by replacing the color filter with the fine spectroscopic element, without significantly changing the configuration of a general color image sensor and the electronic circuit downstream thereof.

DESCRIPTION OF EMBODIMENTS

Hereinafter, embodiments of the present invention will be described in detail with reference to the drawings. However, it goes without saying that the following embodiments are merely examples, and the present invention is not limited to these embodiments.

Figure 1:
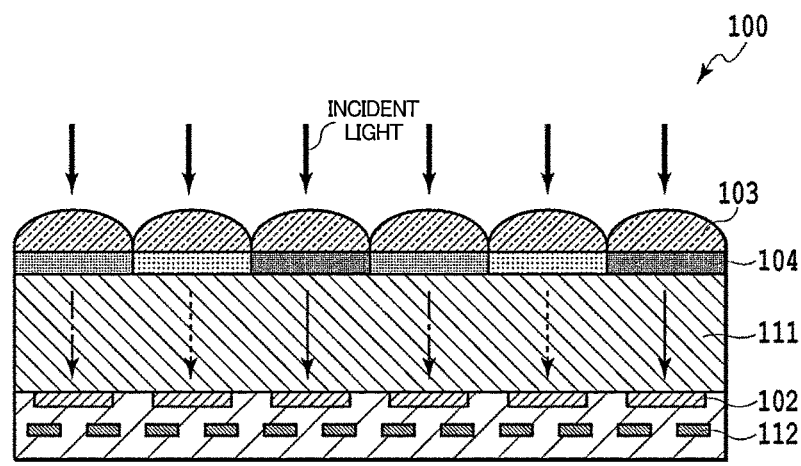
FIG. 1 is a cross-sectional view of a general color image sensor.
Figure 2:
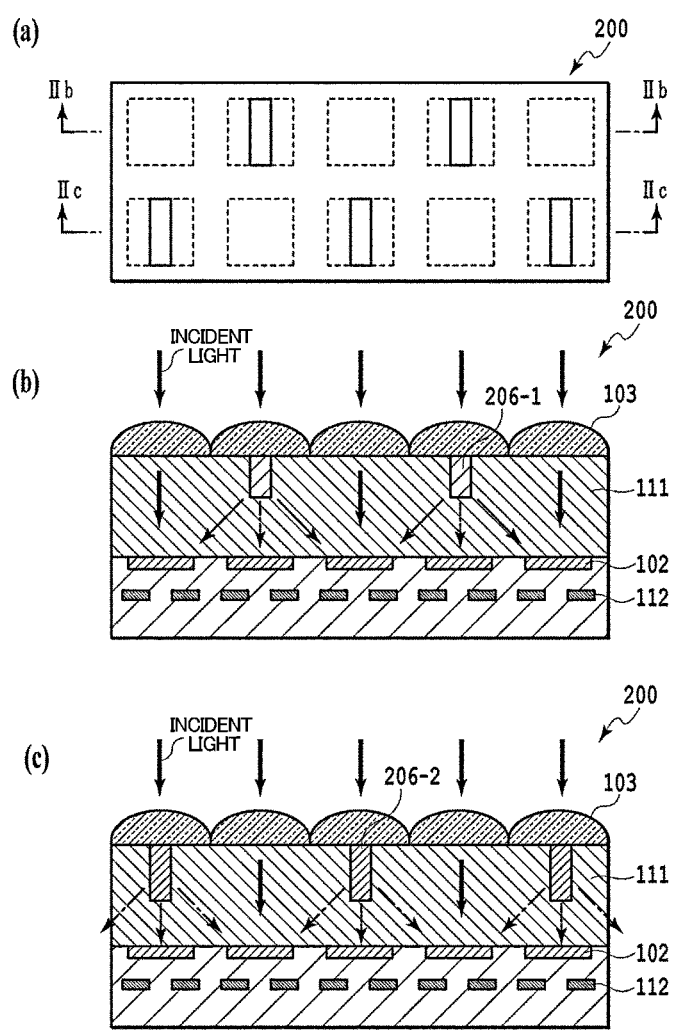
FIG. 2(a) is a top view of the color image sensor proposed in NPL 1.
FIG. 2(b) is a cross-sectional view thereof taken along line IIb-IIb.
FIG. 2(c) is a cross-sectional view thereof taken along line IIc-IIc.
Figure 3:
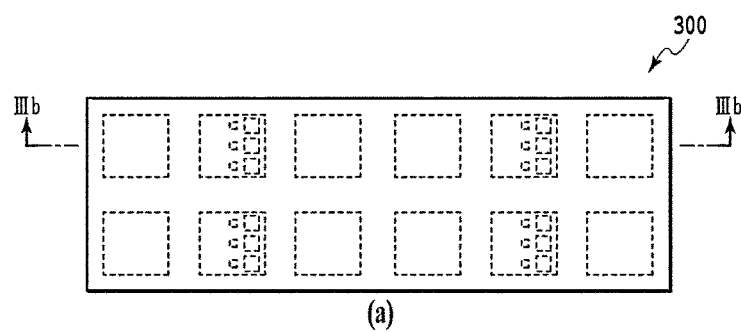
FIG. 3(a) is a top view of the color image sensor proposed in NPL 2.
FIG. 3(b) is a cross-sectional view thereof taken along line IIIa-IIIb.
Figure 3:
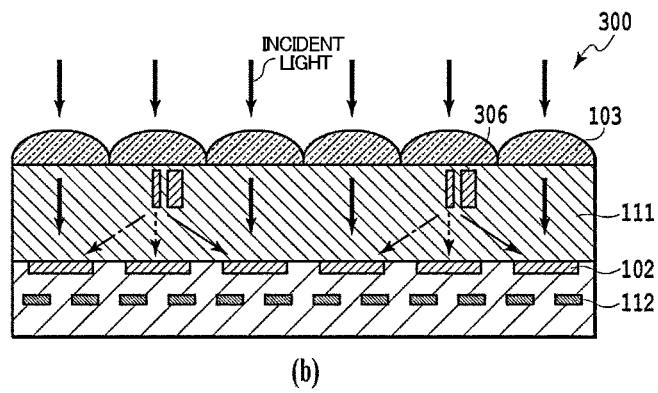
Figure 4:
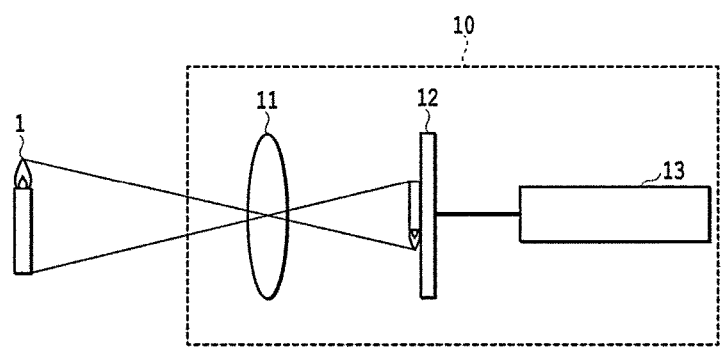
FIG. 4 is a side view showing a schematic configuration of an image capture apparatus 10 according to one embodiment of the present invention.

FIG. 4 is a side view showing a schematic configuration of an image capture apparatus 10 according to an embodiment of the present invention. The image capture apparatus 10 includes a lens optical system 11, an image sensor 12, and a signal processing unit 13 that generates an image signal by processing a photoelectric conversion signal output from the image sensor 12.

Light such as natural light or illumination light is emitted to an object 1, and the light that passes through, is reflected, or is scattered by the object 1, or light emitted from the object 1 forms an optical image on an image sensor 12 including photoelectric conversion elements such as CCDs or CMOSs through a lens optical system 11. In general, a lens optical system is constituted by a lens group consisting of a plurality of lenses aligned along an optical axis in order to correct various optical aberrations, but in FIG. 4, the drawing is simplified, and the lens optical system is shown as a single lens. The signal processing unit 13 generates an image signal by processing a photoelectric conversion signal output from the image sensor 12, and includes an image signal output that sends the generated image signal to the outside. Note that although the image capture apparatus 10 of the present invention can include known constituent elements such as an optical filter for cutting infrared light, an electronic shutter, a viewfinder, a power supply (battery), and a flashlight, description of these components is omitted since they are not particularly necessary for comprehension of the embodiments of the present invention. Also, the above-described configuration is merely an example, and in one embodiment of the present invention, known elements can be appropriately used in combination with each other as the constituent elements other than the lens optical system 11, the image sensor 12, and the signal processing unit 13.

Before the details of the embodiment of the present invention are described, an overview of the image sensor 12 according to an embodiment of the present invention will be described. The image sensor 12 of an embodiment of the present invention includes micro spectroscopic elements 101 and pixels including photoelectric conversion elements 102. A plurality of pixels including the photoelectric conversion elements 102 are arranged in a two-dimensional shape to form a pixel array. Also, a plurality of the micro spectroscopic elements 101 are arranged in a two-dimensional shape to form a spectroscopic element array. A portion of four pixels that are adjacent to each other is provided at a position corresponding to one spectroscopic element. A position corresponding to a spectroscopic element includes, for example, a state in which a portion of four pixels that are adjacent to each other in the pixel array overlaps with a projection surface lowered from the region occupied by the spectroscopic element to the pixel array in a direction orthogonal to the element surface.

Figure 5:
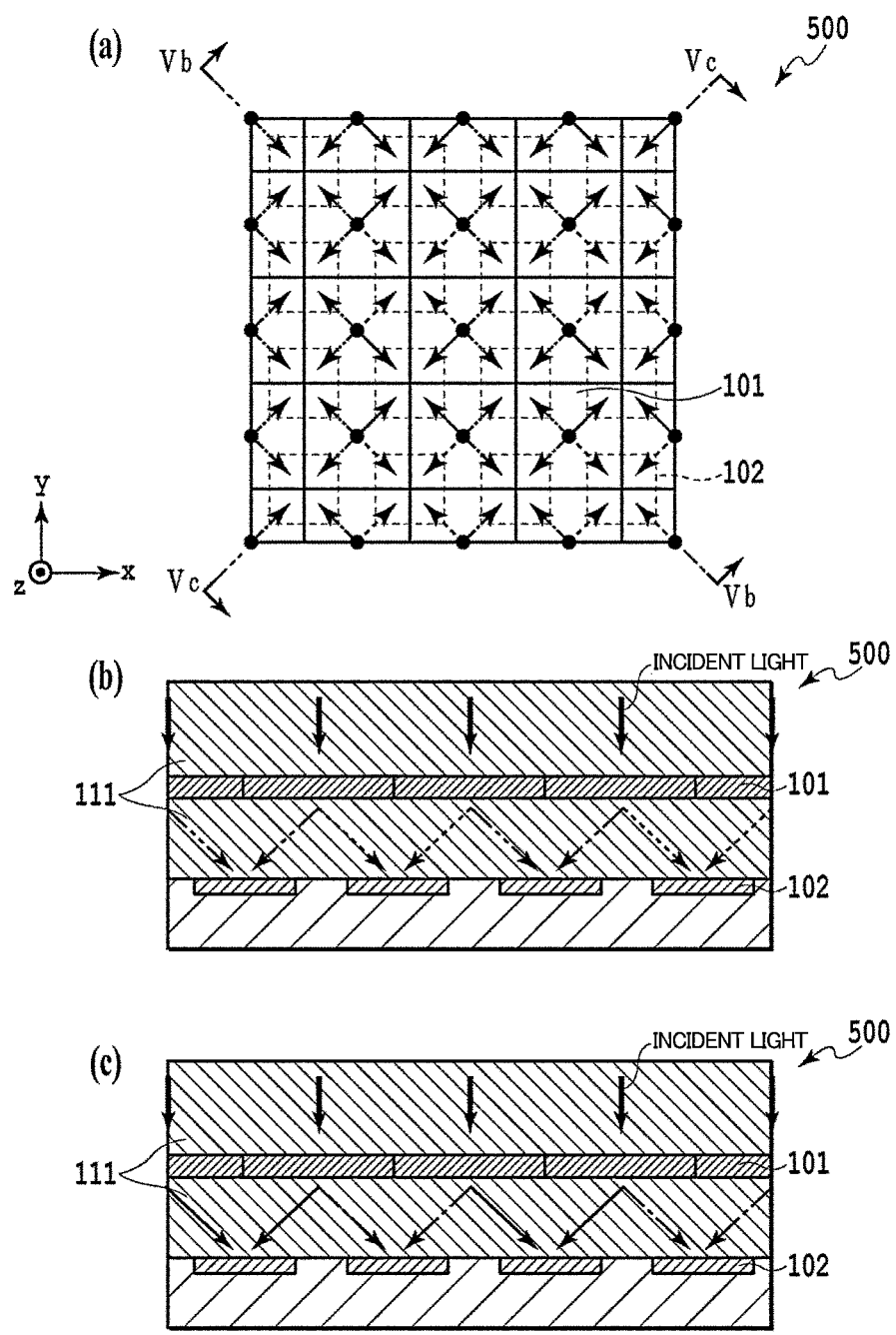
FIG. 5(a) is a diagram schematically showing part of a configuration viewed from the upper surface of an image sensor 500 including a pixel array and a spectroscopic element array.
FIG. 5(b) is a diagram schematically showing a cross section taken along line Vb-Vb.
FIG. 5(c) is a diagram schematically showing a cross section taken along line Vc-Vc.

FIG. 5(a) shows part of the configuration viewed from the upper surface of the image sensor 500 including the pixel array and the spectroscopic element array as an example of the image sensor 12, FIG. 5(b) shows part of the configuration of the image sensor 500 in a cross section taken along line Vb-Vb, and FIG. 5(c) shows part of the configuration of the image sensor 500 in a cross section taken along line Vc-Vc. The spectroscopic element array opposes the pixel array. The spectroscopic element array is arranged on the side where the light from the lens optical system 11 is incident. A transparent layer 111 is provided between the spectroscopic element array and the pixel array, and on the lens optical system 11 side of the spectroscopic element array. Electrical wiring 112 (not shown) is provided on the side of the pixel array opposite to that of the spectroscopic element array.

Each micro spectroscopic element 101 constituting the spectroscopic element array has a microstructure pattern with a constant thickness (length in the z-axis direction). More specifically, each micro spectroscopic element 101 has a has a microstructure pattern in which the thickness is constant, but the shapes of the upper surface and the lower surface differ according to the position of the arrangement. Note that it is also possible to use a microstructure in which the thickness of the micro spectroscopic element 101 differs according to the position. Also, there is no limitation to the microstructure pattern, and various arrangement modes can be used. Note that the image sensor 12 according to the embodiment of the present invention can include known constituent elements such as a microlens and a light-blocking wall, but since their description is not particularly necessary for comprehension of the overview of the present invention, it is omitted in FIGS. 5(a) to 5(c).

In the description of the present embodiment, the light incident on the image sensor 12 is classified into a first wavelength region, a second wavelength region, a third wavelength region, and a fourth wavelength region for each wavelength region. Note that the combination of the first to fourth wavelength regions is generally a combination of three primary colors, namely, red (R: has a light intensity peak in the red wavelength region of wavelengths of 600 nm or more), green (G: has a light intensity peak in the green wavelength region of wavelengths of 500 nm to 600 nm), and blue (B: has a light intensity peak in the blue wavelength region of wavelengths of 500 nm or less), and near-infrared light (IR: has a light intensity peak in the near-infrared wavelength region of wavelengths of 800 nm or more), but there is no limitation to this. For example, the combination of wavelength regions may be a combination of the three primary colors red (R), green (G), and blue (B) and ultraviolet light (UV: has a light intensity peak in the ultraviolet wavelength region of wavelengths of 380 nm or less), may be a combination of a plurality of different wavelength regions in the wavelength region of infrared light, and may be a combination of a plurality of different wavelength regions in the wavelength region of ultraviolet light. Also, the first to third wavelength regions may be wavelength regions that are different from each other, and the fourth wavelength region may be the same as one of the first to third wavelength regions. Each of the micro spectroscopic elements 101 forming the spectroscopic element array according to the embodiment of the present invention has a function of changing the transmission direction of the light incident on the image sensor 12 and spatially splitting light on a pixel array according to the above-described first to third wavelength regions or first to fourth wavelength regions by utilizing the phase delay effect caused by the later-described microstructures, and the structural dimensional dependence and wavelength dependence thereof. That is, in the embodiment of the present invention, the light incident on the image sensor 12 is split in four directions, namely a first direction (upper right), a second direction (lower right), a third direction (lower left), and a fourth direction (upper left) by each micro spectroscopic element 101 and is incident on a portion of four pixels that are adjacent to each other. As a more detailed example, a case will be described in which the micro spectroscopic elements 101 split red (R) in the first direction (upper right), green (G) in the second direction (lower right), blue (B) in the third direction (lower left), and infrared light (IR) in the fourth direction (upper left). Light in the wavelength region of red (R) is incident on a pixel corresponding to red (adjacent on the upper side of the pixel corresponding to green and adjacent on the right side of the pixel corresponding to infrared light) among the four pixels that are adjacent to each other, as light that has a wide spread width (light whose wavelength components are aligned) in the first direction (the incidence angle of light with a short wavelength and the incidence angle of light with a long wavelength are different). Light in the wavelength region of green (G) is incident on a pixel corresponding to green (adjacent on the lower side of the pixel corresponding to red and adjacent on the right side of the pixel corresponding to blue), as light that has a wide spread width (light whose wavelength components are aligned) in the second direction (the incidence angle of light with a short wavelength and the incidence angle of light with a long wavelength are different). Light in the wavelength region of blue (B) is incident on a pixel corresponding to blue (adjacent on the left side of the pixel corresponding to green and adjacent on the lower side of the pixel corresponding to infrared light), as light that has a wide spread width (light whose wavelength components are aligned) in the third direction (the incidence angle of light with a short wavelength and the incidence angle of light with a long wavelength are different). Light in the wavelength region of infrared light (IR) is incident on a pixel corresponding to infrared light (adjacent on the left side of the pixel corresponding to red and adjacent on the upper side of the pixel corresponding to blue), as light that has a wide spread width (light whose wavelength components are aligned) in the fourth direction (the incidence angle of light with a short wavelength and the incidence angle of light with a long wavelength are different).

Also, if four micro spectroscopic elements 101 that are adjacent to each other in directions of two axes of a plane (the x-axis direction and the y-axis direction of an xy plane) are regarded as one spectroscopic unit (the spectroscopic unit is square-shaped), the spectroscopic functions of the four micro spectroscopic elements 101 constituting the one spectroscopic unit are different from each other. Specifically, one spectroscopic unit includes four types of micro spectroscopic elements. For example, the first type of micro spectroscopic element has a spectroscopic function of splitting light in the first wavelength region, second wavelength region, and third wavelength region, and light in the fourth wavelength region in the first direction (upper right), the second direction (lower right), the third direction (lower left), and the fourth direction (upper left), respectively. The second type of micro spectroscopic element has a spectroscopic function of splitting light in the first wavelength region, the second wavelength region, the third wavelength region, and the fourth wavelength region in the second direction (lower right), the first direction (upper right), the fourth direction (upper left), and the third direction (lower left), respectively. The third type of micro spectroscopic element has a spectroscopic function of splitting light in the first wavelength region, the second wavelength region, the third wavelength region, and the fourth wavelength region in the third direction (lower left), the fourth direction (upper left), the first direction (upper right), and the second direction (lower right), respectively. The fourth type of micro spectroscopic element has a spectroscopic function of splitting light in the first wavelength region, the second wavelength region, the third wavelength region, and the fourth wavelength region in the fourth direction (upper left), the third direction (lower left), the third direction (lower right), and the first direction (upper right), respectively.

Accordingly, by setting the distances between the micro spectroscopic elements 101 and the pixels including the photoelectric conversion elements 102 to the distances at which the light split in the first direction (upper right) by the micro spectroscopic element 101, the light split in the fourth direction (upper left) by the micro spectroscopic element adjacent on the right side of the micro spectroscopic element 101, the light split in the third direction (lower left) by the micro spectroscopic element adjacent on the upper right side of the micro spectroscopic element 101, and the light split in the second direction (lower right) by the micro spectroscopic element adjacent on the upper side of the micro spectroscopic element 101 are incident on the photoelectric conversion element 102, the four pixels (photoelectric conversion elements 102) located directly below the respective spectroscopic units each receive only the light in one of the first, second, third, and fourth wavelength regions. When light is incident on a pixel, the photoelectric conversion element 102 outputs an electric signal (photoelectric conversion signal) corresponding to the intensity of the incident light, and therefore a signal corresponding to the wavelength region (color information if three primary colors are used) is directly acquired. Since the above-described micro spectroscopic elements 101 and a plurality of pixels (photoelectric conversion elements 102) corresponding to the micro spectroscopic elements are arranged in a two-dimensional shape, information of each wavelength region of the optical image of the object formed by the lens optical system can be acquired at the same time without using special signal processing. Also, in this configuration, since light is split along the directions of two axes of a plane, the influence of optical crosstalk between any pixels is equal, and therefore an image having a uniform spatial resolution can be generated.

In a later-described first embodiment, the first to third wavelength regions are the three primary colors R, G, and B, and the fourth wavelength region is the same as the second wavelength region, and incident light is spatially split in four directions for each wavelength region of R, G, B, and G by the micro spectroscopic element 101. That is, almost all of the incident light is incident on the four adjacent pixels (photoelectric conversion elements 102) located directly below the micro spectroscopic element 101 in a state where almost all of the incident light is split into the wavelength regions of R, G, and B. Note that light in the same wavelength region is incident on two of the four pixels. Accordingly, the color information can be directly acquired from the photoelectric conversion signals obtained from the pixels (photoelectric conversion elements 102).

Also, in a later-described second embodiment, the first to third wavelength regions are the three primary colors R, G, and B, the fourth wavelength region is infrared light IR, and the micro spectroscopic element 101 spatially splits the incident light in four directions for each wavelength region of R, G, B, and IR. That is, almost all of the incident light is incident on the four adjacent pixels (photoelectric conversion elements 102) located directly below the micro spectroscopic element 101 in a state where almost all of the incident light is split into the wavelength regions of R, G, B, and IR. Note that light in wavelength regions that are all different from each other is incident on the four pixels. Accordingly, color information and IR information can be directly acquired from the photoelectric conversion signals obtained from the pixels (photoelectric conversion elements 102).

According to the image sensor 12 of the embodiment of the present invention, information of each wavelength region of an optical image of an object can be acquired through light splitting for each wavelength region using the micro spectroscopic elements 101 without using a light reduction band pass filter and without using special signal processing. That is, if the first to fourth wavelength regions are the three primary colors R, G, B, and G, a color image can be acquired. Accordingly, compared to an image sensor using color filters, the total amount of light reaching the pixel array can be increased, and the sensitivity of color image capture can be increased. Also, if the first to fourth wavelength regions are the three primary colors R, G, and B and IR, an IR image can be acquired simultaneously with high sensitivity in addition to a color image. Furthermore, since information of each wavelength region is acquired through light splitting along directions of two axes of a plane on the pixel array, the effect of optical crosstalk between any pixels is equal, and an image having uniform spatial resolution can be generated, whereby the problems with the techniques disclosed in NPL 1 and NPL 2 can be solved. Furthermore, with the image sensor 12 according to the embodiment of the present invention, there is no need to change the microlens shape, the pixel shape, or the pixel arrangement such as the Bayer arrangement, which are commonly used, and therefore the image sensor 12 is advantageous in that it has high compatibility with existing production processes and image capture systems and the effects can be obtained by merely replacing the filters with the micro spectroscopic elements.

Hereinafter, embodiments of the present invention will be described in greater detail with reference to the drawings.

First Embodiment

Hereinafter, an overview of a configuration of an image sensor according to the present embodiment will be described.

In the present embodiment, a mode is indicated in which the first to third wavelength regions are the three primary colors R, G, and B, the fourth wavelength region is the same as the second region, and the incident light is split into R, G, B, and G, but there is no limitation to the number of wavelength regions into which the light is split and the wavelength of each wavelength region. For example, at least one of the four wavelength regions may be light having a wavelength other than those three primary colors (e.g., infrared light or ultraviolet light).

Figure 6:
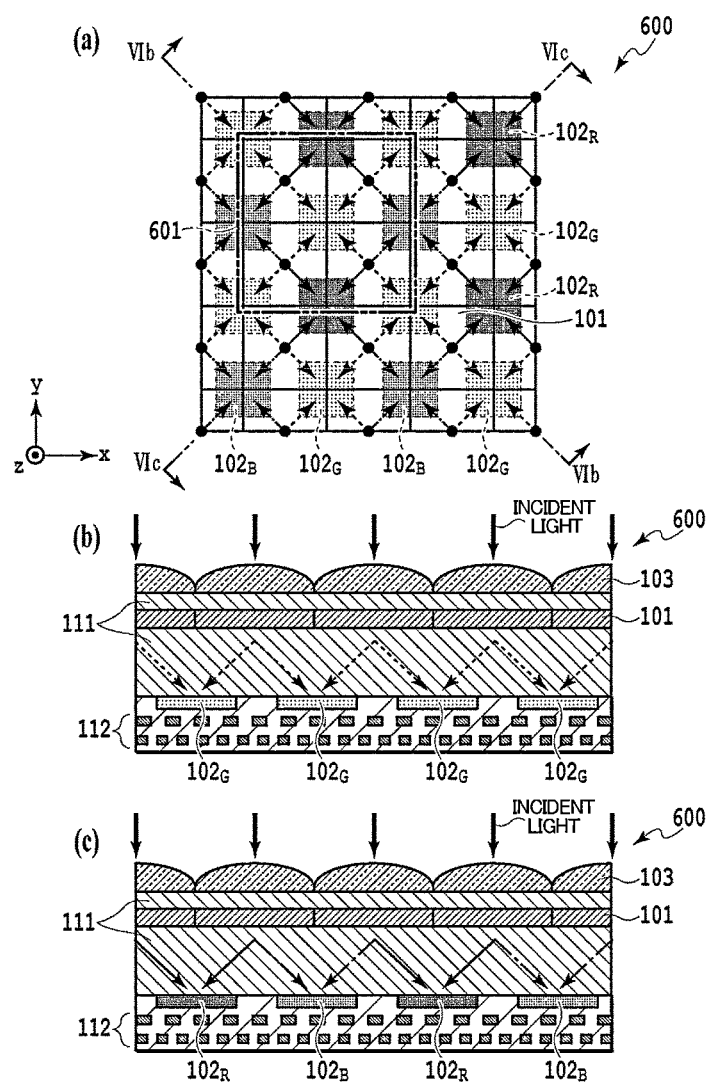
FIG. 6(a) is a diagram schematically showing part of a configuration viewed from the upper surface of an image sensor 600 including a pixel array and a spectroscopic element array.
FIG. 6(b) is a diagram schematically showing a cross section taken along line VIb-VIb.
FIG. 6(c) is a diagram schematically showing a cross section taken along line VIc-VIc.

FIG. 6(a) schematically shows part of a schematic configuration viewed from the upper surface of an image sensor 600 including a pixel array and a spectroscopic element array, as an example of the image sensor 12 according to the first embodiment. FIG. 6(b) shows part of the configuration of the image sensor 600 in a cross section taken along line VIb-VIb. FIG. 6(c) shows part of the configuration of the image sensor 600 in a cross section taken along line VIc-VIc. A transparent layer 111 that has a low refractive index and is made of $SiO_2$ or the like and a plurality of microlenses 103 are stacked on a two-dimensional pixel array in which pixels including photoelectric conversion elements 102 are arranged so as to be in the form of an array. The micro spectroscopic elements 101 are embedded inside the transparent layer 111 having a low refractive index.

The micro spectroscopic elements 101 include a plurality of microstructures made of a material such as SiN or $TiO_2$, which have a refractive index higher than the refractive index of the transparent layer 111. The plurality of microstructures are formed so as to have a microstructure pattern. For convenience, in the following description, an xyz orthogonal coordinate system is set in which the normal-line direction of a two-dimensional pixel array is the z-axis, the horizontal direction parallel to the two-dimensional pixel array is the x-axis, and the direction orthogonal to the x-axis parallel to the two-dimensional pixel array is the y-axis.

As shown in FIGS. 6(a) to 6(c), microlenses 103, micro spectroscopic elements 101, and pixels (photoelectric conversion elements 102) are arranged in a grid pattern with the same period to form an array. One micro spectroscopic element 101 is arranged directly below each microlens 103. Also, the microlens array and the micro spectroscopic element array are each shifted along the x-axis and the y-axis by half the length of the array period (the distance between the centers) from the arrangement of the pixel array. The position of half the length of the array period in the x-axis direction from a boundary with a micro spectroscopic element adjacent in the x-axis direction and the position of half the length of the array period in the y-axis direction from a boundary with a micro spectroscopic element adjacent in the y-axis direction in a micro spectroscopic element 101 is the center of the micro spectroscopic element 101. At this time, as shown in FIG. 6(a), the center of a micro spectroscopic element 101 is located directly above the center of a quadrangular shape formed by the four micro spectroscopic elements 101 that are adjacent to each other and are located directly below the micro spectroscopic element 101. The micro spectroscopic element array is composed of the micro spectroscopic elements 101 that spatially split incident light in each of three wavelength regions (R, G, and B) along four directions that are parallel to directions that are ±45 degrees with respect to the x-axis on the plane. Also, assuming that four adjacent micro spectroscopic elements 101 are one spectroscopic unit 601 (indicated by a two-dot broken line rectangle in FIG. 6(a)), it can be seen that the spectroscopic units of the micro spectroscopic element array form an array in a grid pattern. The four adjacent micro spectroscopic elements 101 forming the spectroscopic unit have different combinations of four directions assigned to each of the three wavelength regions, and are arranged such that light in the same wavelength region is incident on each of the four pixels located directly below the unit. Note that light in the same wavelength region is incident on two of the four pixels located directly below each micro spectroscopic element 101. The above-described unit may be formed by rotating one type of micro spectroscopic element having the same spectroscopic function by 90 degrees, or by inverting, or may be constituted by four types of micro spectroscopic elements 101 that respectively realize four types of spectroscopic functions. The spectroscopic unit shown in FIG. 6(a) includes an element that splits R light (solid line) in the first direction (upper right), G light (broken lines) in the second direction (lower right), B light (one-dot chain line) in the third direction (lower left) and G light (broken line) in the fourth direction (upper left). Furthermore, on the right side, the lower side, and the lower right of the element, the spectroscopic unit includes an element obtained by rotating the element 90 degrees counterclockwise, an element obtained by rotating the element 90 degrees clockwise, and an element obtained by inverting the element.

Note that in the above description, as an example, a case of a two-dimensional pixel array composed of square pixels (photoelectric conversion elements 102) arranged in an orthogonal grid pattern has been described, but the pixel arrangement, shape, size, and the like are not limited to the example of this drawing. Also, although omitted in FIGS. 6(a) to 6(c), between the two-dimensional pixel array and the micro spectroscopic element array, it is possible to include a structure that operates as an internal microlens and has a light collection function achieved through a concavo-convex structure with a higher refractive index than the transparent layer composed of SiN, TiO₂ or the like, and acts so as to guide the light from the micro spectroscopic element 101 to the photoelectric conversion element 102 in the pixel. The structure shown in FIGS. 6(a) to 6(c) can be manufactured using a known semiconductor manufacturing technique.

Note that although the image sensor 600 shown in FIGS. 6(a) to 6(c) has a back-illuminated structure in which light is incident from the side opposite to the wiring layer on which the electrical wiring 112 is formed, the present embodiment is not limited to such a structure, and may have, for example, a surface-illuminated structure that receives light from the side of the wiring layer.

Hereinafter, the function of each constituent element of the image sensor 600 according to the present embodiment will be described.

White light incident on the image sensor 600 is first collected by the microlens array, and almost all the light passes through the micro spectroscopic elements 101 corresponding to the microlenses 103. The light is spatially split in four directions for each of the three wavelength regions by each micro spectroscopic element 101, and is received by four adjacent pixels (photoelectric conversion elements 102) located directly below each micro spectroscopic element 101. Due to the configuration of the spectroscopic unit, light in the wavelength range of one of R, G, and B is incident on each pixel of the pixel array located directly below the micro spectroscopic element array, and therefore each pixel corresponds to the detection of color information of one of R, G, and B. Note that if four pixels are one pixel unit, the example of FIGS. 6(a) to 6(c), is an example that is suitable for the Bayer arrangement in which four pixels respectively correspond to the light of R, G, G, and B, and depending on the configuration of each micro spectroscopic element 101, the combination of color components and transmission directions can be freely changed, and the arrangement of the pixels corresponding to each of R, G, and B is also changed accordingly. Finally, the photoelectric conversion element 102 in each pixel performs photoelectric conversion and outputs an image signal including color information.

Note that although a structure having a light collection function achieved through a concavo-convex structure with a higher refractive index than that of the transparent layer composed of SiN, TiO₂, or the like, which operates as internal microlenses, can be included between the pixel array and the micro spectroscopic element 101, the internal microlenses can also be omitted since the later-described micro spectroscopic elements 101 can have a lens function depending on the formed phase delay distribution.

Hereinafter, the micro spectroscopic element 101 in this embodiment will be described.

In order for the micro spectroscopic element 101 to spatially split the incident light for each of the three wavelength regions (R, G, B) along the above-mentioned four directions, it is necessary to provide the light passing through one micro spectroscopic element 101 with a different phase delay distribution for each wavelength region, and change the optical wavefront.

Figure 7:
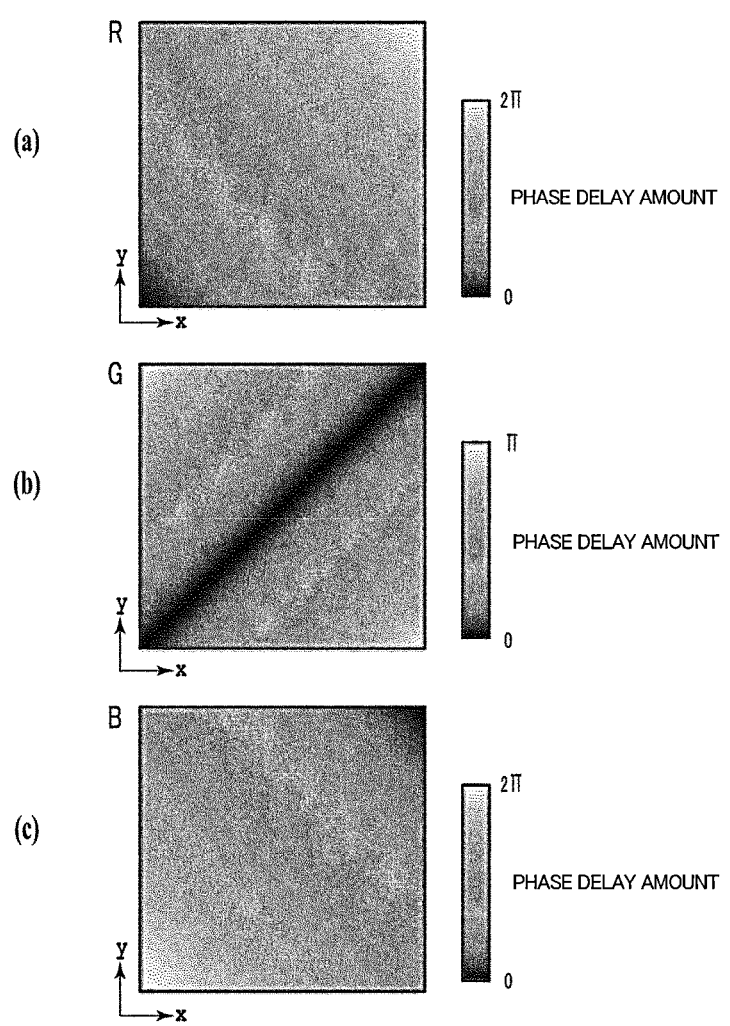
FIG. 7(a) is a diagram showing a phase delay distribution of wavelengths corresponding to a first wavelength region (R)
FIG. 7(b) is a diagram showing a phase delay distribution of wavelengths corresponding to a second wavelength region (G)
FIG. 7(c) is a diagram showing a phase delay distribution of wavelengths corresponding to a third wavelength region (B).

FIGS. 7(a) to 7(c) are examples of phase delay distributions of the micro spectroscopic element 101 capable of realizing the above-mentioned spectroscopic characteristics. In this example, as shown in FIG. 7(a), the phase delay distribution for the wavelength corresponding to the first wavelength region (R) forms a distribution in which the phase delay amount increases linearly from 0 to $2\pi$ from the lower left to the upper right, as shown in FIG. 7(b), the phase delay distribution for the wavelength corresponding to the second wavelength region (G) forms a distribution in which the phase delay amount increases linearly from 0 to $\pi$ from the upper left to the center and the phase delay amount decreases linearly from $\pi$ to 0 from the center to the lower right, and as shown in FIG. 7(c), the phase delay distribution for the wavelength corresponding to the third wavelength region (B) forms a distribution in which the phase delay amount increases linearly from 0 to $2\pi$ from the upper right to the lower left. Light that has passed through an element having such a phase delay distribution is transmitted while the first wavelength region (R) is deflected in the upper right direction, the second wavelength region (G) is deflected in the upper left and lower right directions, and the third wavelength region (B) is deflected in the lower left direction. Note that the above description is an example, and the combination of wavelength regions and transmission directions can be freely changed according to the phase delay distribution. The phase delay distribution as described above can be realized by appropriately designing the material, number, shape, size, pattern, and the like of the microstructures, as will be described later. That is, with the micro spectroscopic element 101 in the present embodiment, the microstructures are arranged on a two-dimensional plane, different optical wavefronts are provided to the incident light according to the wavelength region, and the color components are spatially split.

Figure 8:
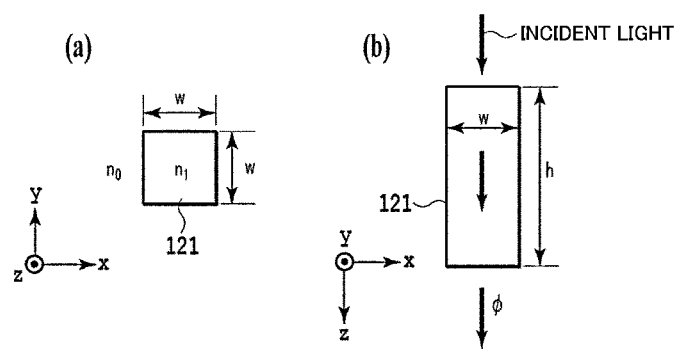
FIG. 8(a) is a top view of an example of a microstructure included in a micro spectroscopic element 101 according to the present embodiment.
FIG. 8(b) is a side view of an example of the microstructure.

FIG. 8(a) shows an upper surface of an example of a microstructure included in the micro spectroscopic element 101 according to the present embodiment, and FIG. 8(b) shows a side view of the microstructure. A columnar structure 121, which is an example of the microstructure, is made of a material such as SiN or TiO₂, which has a refractive index $n_1$ that is higher than a refractive index $n_0$ of the transparent layer 111, and a thickness h of the structure is constant. The bottom surface and the top surface of the columnar structure 121 are square. The columnar structure 121 can be thought of as an optical waveguide in which light is confined in the structure and transmitted, based on the difference in refractive index between the transparent layer 111 and the columnar structure 121. Accordingly, light that has entered from the upper surface side is transmitted while being strongly confined in the columnar structure 121, receives the phase delay effect determined by the effective refractive index $n_{eff}$ of the optical waveguide, and exits from the bottom surface side. Specifically, when the phase of light being transmitted through the transparent layer 111 by a length corresponding to the thickness of the structure is used as a reference, the phase delay amount φ achieved by the columnar structure 121 is indicated by formula (1), where λ is the wavelength of light in a vacuum.

$$\varphi (n_{eff} - n_0) \times 2\pi h/\lambda \quad (1)$$

Since this phase delay amount φ differs depending on the wavelength λ of the light, it is possible to provide the light with a different phase delay amount depending on the wavelength region (color component) in the same columnar structure 121. Furthermore, it is known that $n_{eff}$ is a function of the width w of the columnar structure 121, and takes a value that satisfies $n_0 < n_{eff} < n_1$. Accordingly, in the examples shown in FIGS. 8(a) and 8(b), it is possible to set various combinations of phase delay amounts according to the wavelength λ of light by changing the width w of the columnar structure 121. Also, since the bottom surface and the top surface of the columnar structure 121 are square, there is no change in the optical characteristics including the phase delay effect even when the polarization direction of the incident light is changed.

The width w of the columnar structure 121 is set according to the position so that the above structure conforms to the phase delay distribution described above with reference to FIGS. 7(a) to 7(c), and a plurality of the columnar structures 121 are set on the two-dimensional plane, whereby it is possible to realize the micro spectroscopic element according to the present embodiment. Also, in the arrangement of each of the columnar structures 121 described above, it is desirable to arrange the columnar structures 121 at an interval that is less than or equal to the wavelength of the light in order to prevent the occurrence of unnecessary diffracted light caused by the periodic structure. Note that a distribution in which the phase delay distribution changes from 0 to 2π is suitable for efficiently deflecting light, and the variable range of the phase delay amount resulting from the columnar structure 121 with a constant thickness in each wavelength range is preferably 2π or more. Therefore, based on formula (1), when the desired median wavelength in the wavelength region on the longest wavelength side of the wavelength region into which the light is to be split is $\lambda_r$, it is desirable that the thickness h of the structure is set to $h = \lambda_r/(n_1 - n_0)$ or more. In the above-described example, a case where the bottom surface and the top surface of the columnar structure 121 are square was described, but there is no limitation to this shape. That is, as long as the shape surface includes four-fold rotational symmetry with the center of the surface serving as the axis of symmetry, there will be no dependency with respect to polarization of the spectroscopic function, and operation as an optical waveguide that provides a phase delay effect will not be lost. Accordingly, it is desirable to employ a columnar structure having four-fold rotationally symmetric surfaces, such as squares, hollow squares, circles, hollow circles, and cross shapes. A micro spectroscopic element including such microstructures having a constant thickness is disclosed in, for example, NPL 2.

Also, the micro spectroscopic element 101 according to the present embodiment is not limited to the above-described columnar structure 121, and various forms of microstructures can be used thereas. For example, as disclosed in NPL 3, a microstructure that has a structure pattern optimized by a computer and has a constant thickness can form a phase delay distribution for each wavelength region using the same principle as that described above, and can spatially split the color components. Furthermore, according to formula (1), it is possible to set a wider variety of combinations of phase delay amounts according to the wavelength λ of light by changing the thickness h of the structure in addition to the width w of the columnar structure 121. Accordingly, it is possible to realize the micro spectroscopic element according to the present embodiment by setting the width w and the thickness h of the microstructures according to the positions where the microstructures are arranged so as to match the above-mentioned phase delay distribution, and arranging a plurality of the microstructures on a two-dimensional plane.

The micro spectroscopic element 101 having the above-described spectroscopic function can be produced by executing thin film deposition and patterning using a known semiconductor manufacturing technique.

As described above, it is possible to provide desired spectroscopic characteristics by appropriately designing the material, number, shape, size, pattern, and the like of the structure constituting the micro spectroscopic element. As a result, as described above, light in a desired wavelength region can be split and caused to be incident on each pixel, and a signal corresponding to the wavelength region can be obtained directly from the photoelectric conversion signal output from the photoelectric conversion element in each pixel. Also, if the material constituting the micro spectroscopic element has low loss, almost no light loss occurs, and therefore the total amount of light that reaches the pixel array can be dramatically increased compared to an image sensor using a conventional filter, and it is possible to increase the sensitivity of color image capture. Also, since information on each wavelength region is acquired through light splitting along directions of two axes of a plane on the pixel array, it is possible to generate an image in which the effect of optical crosstalk between any pixels is equal and that has a uniform spatial resolution. Also, in the present embodiment, an image sensor using a mode of a single spectroscopic element array will be described, but it is also possible to realize the image sensor using a mode in which multiple spectroscopic element arrays are overlaid in the z-axis direction instead of the single spectroscopic element array. That is, the micro spectroscopic elements 101 constituting a single spectroscopic element array may split the incident light in two-dimensional directions (directions of two axes of a plane), and a plurality of micro spectroscopic elements overlaid in the light transmission direction (z-axis direction) may split the incident light in two-dimensional directions. Note that even if the spectroscopic performance of each micro spectroscopic element is slightly different from the above-mentioned ideal performance, favorable color information can be obtained by correcting and calculating the acquired signal according to the degree of the difference in performance.

Note that in order to minimize optical crosstalk between pixels on the pixel array after the color components are split by the micro spectroscopic elements, it is desirable that each split light is incident on the vicinity of the center of each pixel. Accordingly, it is preferable that the distance between the output end of the micro spectroscopic element and the photoelectric conversion element is near $2^{0.5}P/\tan\theta$, where the angle between the transmission direction of the light deflected by the micro spectroscopic element and the normal-line direction of the pixel array is θ and the period of the pixel array is P.

In the above description, an image sensor in the case where only the micro spectroscopic elements are used was described. Next, a modified example used when a color reduction-type color filter is used in combination will be described.

Figure 9:
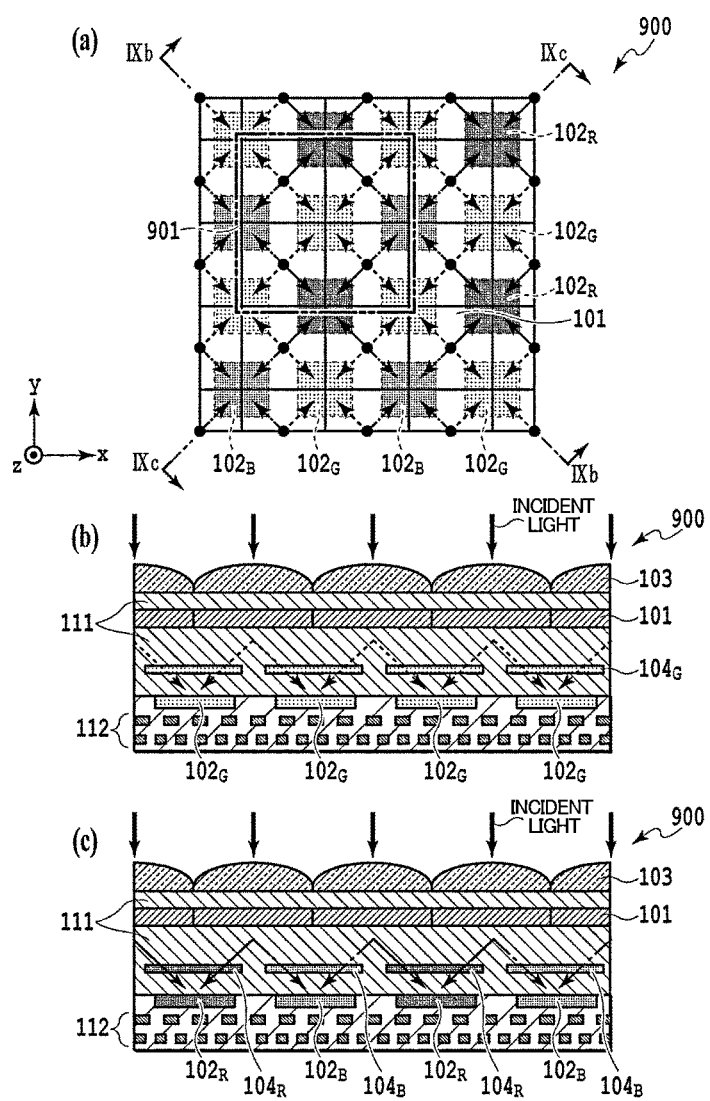
FIG. 9(a) is a diagram schematically showing part of a configuration viewed from the upper surface of an image sensor 900 including a pixel array and a spectroscopic element array.
FIG. 9(b) is a diagram schematically showing a cross section taken along line IXb-IXb.
FIG. 9(c) is a diagram schematically showing a cross section taken along line IXc-IXc.

FIG. 9(a) shows an image sensor 900 including a pixel array and a spectroscopic element array according to a modified example of the present embodiment. FIG. 9(b) shows part of the configuration of the image sensor 900 in a cross section taken along line IXb-IXb. FIG. 9(c) shows part of the configuration of the image sensor 900 in a cross section taken along line IXc-IXc. The difference from the image sensor 600 shown in FIGS. 6(a) to 6(c) is that color filters $104_R$, $104_G$, and $104_B$ corresponding to the pixel colors are arranged above the pixels corresponding to the color components, but other respects are the same. In the case of this configuration, the incident light is color-split by the micro spectroscopic elements 101, and is thereafter filtered by the color filters 104 directly above the pixels (photoelectric conversion elements 102). In this case, since the color filters 104 are passed through after the color splitting, the light utilization efficiency is improved compared to the configuration of only the color filters of the prior art, but the light utilization efficiency decreases compared to the configuration of only the micro spectroscopic elements 101 since it is necessary to pass through two elements. Also, since the light is incident on each pixel in a state in which the spectroscopic characteristics of the micro spectroscopic element 101 and the filtering characteristics of the color filter 104 are multiplied with each other and unnecessary color components are further eliminated, color reproducibility is greatly improved compared to the configuration of only the color filters 104 and the configuration of only the micro spectroscopic elements 101. Accordingly, it can be said that the configuration has a good light utilization rate, that is, a good balance between the sensitivity and the color reproducibility.

Second Embodiment

Next, an overview of a configuration of an image sensor according to a second embodiment of the present invention will be described.

Figure 10:
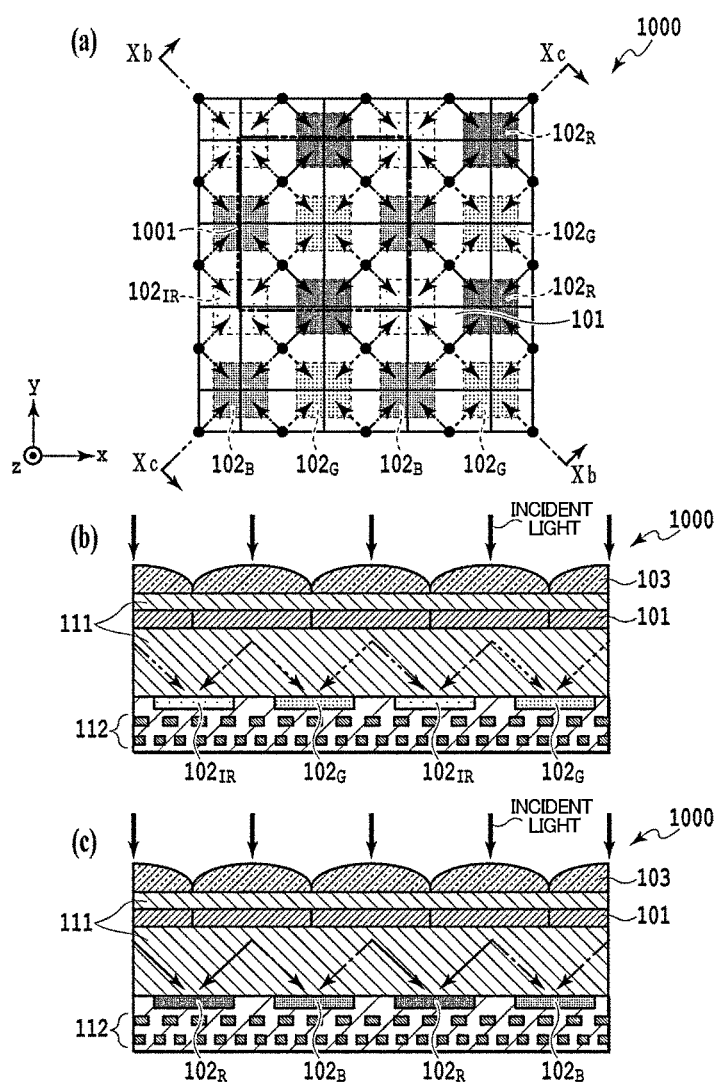
FIG. 10(a) is a diagram schematically showing part of a configuration viewed from the upper surface of the image sensor 900 including a pixel array and a spectroscopic element array.
FIG. 10(b) is a diagram schematically showing a cross section taken along line Xb-Xb.
FIG. 10(c) is a diagram schematically showing a cross section taken along line Xc-Xc.

FIG. 10(a) schematically shows part of a schematic configuration of an image sensor 1000 including a pixel array and a spectroscopic element array as viewed from above as an example of the image sensor 12, FIG. 10(b) shows part of a configuration of the image sensor 1000 in a cross section taken along line Xb-Xb, and FIG. 10(c) shows part of the configuration of the image sensor 1000 in a cross section taken along line Xc-Xc. As is evident from FIGS. 10(a) to 10(c), the image sensor 1000 of the present embodiment and an image capture apparatus 10 using the image sensor 1000 differ from the image sensor of the first embodiment in that the first to fourth wavelength regions are the three primary colors R, G, and B, and infrared light (IR), and the incident light is spatially split in four directions for each wavelength region of R, G, B, and IR by the micro spectroscopic elements 101. Accordingly, almost all of the incident light is incident on the four pixels (photoelectric elements $102_R$, $102_G$, $102_B$, and $102_{IR}$) located directly below the micro spectroscopic elements 101 in a state in which almost all of the incident light is split into the wavelength regions of R, G, B, and IR. Note that the other constituent elements are the same as those of the image sensor of the first embodiment. Hereinafter, the differences from the first embodiment will mainly be described, and description of points of overlap will be omitted.

As shown in FIGS. 10(a) to 10(c), the microlenses 103, the micro spectroscopic elements 101, and the pixels (photoelectric conversion elements 102) are arranged in the form of grids at the same period on the xy plane, each of them forms an array, and one micro spectroscopic element 101 is arranged on the central axis of each microlens 103. Also, the microlens array and the micro spectroscopic element array are respectively shifted along the x-axis and the y-axis by half the length of the array period from the arrangement of the pixel array. The micro spectroscopic element array is composed of the micro spectroscopic elements 101 that spatially split the incident light along four directions parallel to directions that are ±45 degrees with respect to the x-axis for each of four wavelength regions (R, G, B, and IR). Also, assuming that four adjacent micro spectroscopic elements are one spectroscopic unit (indicated by a two-dot broken line rectangle in FIG. 10(a)), it can be seen that the spectroscopic units form an array in a grid pattern in the micro spectroscopic element array. The micro spectroscopic elements 101 forming the spectroscopic unit are arranged so that the combinations of four directions assigned to each of the four wavelength regions are different from each other, and light in the same wavelength region is incident on each of the four pixels located directly below the unit. Note that light in wavelength regions that are all different from each other is incident on the four pixels. The above-described unit may be formed with one type of micro spectroscopic element having the same spectroscopic function rotated 90 degrees or inverted, or may be constituted by four types of micro spectroscopic elements 101 that respectively realize four types of spectroscopic functions. The spectroscopic unit shown in FIG. 10(a) includes an element that has a spectroscopic function of splitting R light (solid line) in the first direction (upper right), G light (broken line) in the second direction (lower right), B light (one-dot chain line) in the third direction (lower left), and IR light (two-dot broken line) in the fourth direction (upper left), and further includes, on the right side, lower side, and lower right of the element, an element obtained by rotating the element 90 degrees counterclockwise, an element obtained by rotating the element 90 degrees clockwise, and an element obtained by inverting the element.

White light incident on the image sensor 1000 is first collected by the microlens array, and almost all of the light passes through the micro spectroscopic elements 101 corresponding to the microlenses 103. Light is spatially split in four directions in each of the four wavelength regions by the micro spectroscopic element 101, and is received by four pixels (photoelectric conversion elements 102) located directly below the micro spectroscopic element 101. Due to the configuration of the spectroscopic unit, light in the wavelength range of R, G, B, or IR is incident on each pixel of the pixel array located directly below the micro spectroscopic element array, and therefore each pixel corresponds to detection of wavelength region information of R, G, B, or IR. Note that depending on the configuration of each micro spectroscopic element 101, the combination of wavelength regions and transmission directions can be freely changed, and the arrangement of pixels corresponding to R, G, B, and IR is also changed accordingly. Finally, the photoelectric conversion elements 102 in the pixels perform photoelectric conversion and output image signals including color information and IR information.

Figure 11:
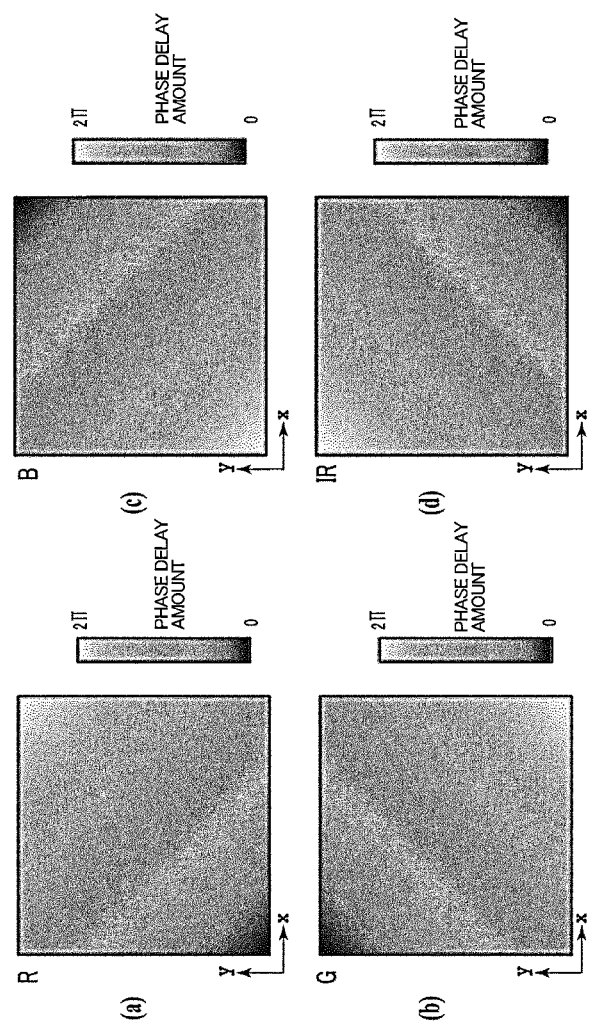
FIG. 11(a) is a diagram showing a phase delay distribution of wavelengths corresponding to the first wavelength region (R)
FIG. 11(b) is a diagram showing a phase delay distribution of wavelengths corresponding to the second wavelength region (G)
FIG. 11(c) is a diagram showing a phase delay distribution of wavelengths corresponding to the third wavelength region (B)
FIG. 11(d) is a diagram showing the phase delay distribution of wavelengths corresponding to a fourth wavelength region (IR).

FIGS. 11(a) to 11(c) are examples of phase delay distributions that realize spatial splitting of incident light in each of the four wavelength regions (R, G, B, IR). In this example, as shown in FIG. 11(a), the phase delay distribution of the wavelength corresponding to the first wavelength region (R) forms a distribution in which the phase delay amount increases linearly from 0 to $2\pi$ from the lower left to the upper right. As shown in FIG. 10(b), the phase delay distribution of the wavelength corresponding to the second wavelength region (G) forms a distribution in which the phase delay amount increases linearly from 0 to $2\pi$ from the upper left to the lower right. As shown in FIG. 10(c), the phase delay distribution of the wavelength corresponding to the third wavelength region (B) forms a distribution in which the phase delay amount increases linearly from 0 to $2\pi$ from the upper right to the lower left. As shown in FIG. 10(d), the phase delay distribution of the wavelength corresponding to the fourth wavelength region (IR) forms a distribution in which the phase delay amount increases linearly from 0 to $2\pi$ from the lower right to the upper left. In the light that has passed through the element having such a phase delay distribution, the first wavelength region (R) is transmitted while being deflected in the upper right direction, the second wavelength region (G) is transmitted while being deflected in the lower right direction, the third wavelength region (B) is transmitted while being deflected in the lower left direction, and the fourth wavelength region (IR) is transmitted while being deflected in the upper left direction. Note that the above description is an example, and the combination of the wavelength regions and the transmission directions can be freely changed according to the phase delay distribution. The phase delay distribution as described above can be realized by appropriately designing the material, number, shape, size, pattern, and the like of the microstructure, similarly to the image sensor of the first embodiment.

According to the above description, in the configuration of the present embodiment, IR information can be also acquired at the same time in addition to color information. The present embodiment is the same as the first embodiment except for the above, has the same effect as that described in the first embodiment, and can be modified in the same manner.

The first embodiment and the second embodiment described above are merely suitable specific examples of the present invention, and the present invention is not limited thereto, and various modifications can be made.

In the first embodiment and the second embodiment described above, examples were shown in which SiN and $TiO_2$ are envisioned as materials of the micro spectroscopic elements, but the present invention is not limited thereto. For example, if the image sensor of the embodiment of the present invention is used in the visible light to near-infrared light region where the wavelength of light is in the range of 380 to 1000 nm, materials such as SiN, SiC, $TiO_2$, and GaN are suitable as the material of the micro spectroscopic elements since they have a high refractive index and low absorption loss. Also, for near-infrared light having a wavelength in the range of 800 to 1000 nm, materials such as Si, SiC, SiN, $TiO_2$, GaAs, and GaN are suitable as materials having low loss for these lights. Furthermore, in the near-infrared region of a long-wavelength body (1.3 µm, 1.55 µm, etc., which are communication wavelengths), InP or the like can be used in addition to the above-mentioned materials. Furthermore, if the micro spectroscopic elements are formed through adhesion and coating, a polyimide such as fluorinated polyimide, BCB (benzocyclobutene), a photocurable resin, a UV epoxy resin, an acrylic resin such as PMMA, a polymer such as a general resist, or the like are examples of materials.

Also, in the first embodiment and the second embodiment, an example in which $SiO_2$ is envisioned as the material of the transparent layer 111 was shown, but the present invention is not limited thereto. Any material having a refractive index lower than the refractive index of the material of the micro spectroscopic elements 101 and a low loss with respect to the wavelength of incident light, such as a general glass material, $SiO_2$, and an air layer, may be used.

Although the above description has been given based on the image sensor according to the embodiment of the present invention and the image capture apparatus using the image sensor, the present invention is not limited to the above-described embodiment, and it goes without saying that various modifications are possible without departing from the gist of the present invention.

The invention claimed is:

1. An image sensor comprising:
   a two-dimensional pixel array in which a plurality of pixels including photoelectric conversion elements are arranged in the form of an array on a substrate;
   a transparent layer formed on the two-dimensional pixel array; and
   a two-dimensional spectroscopic element array in which a plurality of spectroscopic elements are arranged in the form of an array inside or on the transparent layer,
   wherein:
   each of the spectroscopic elements includes a plurality of microstructures made of a material having a refractive index that is higher than a refractive index of the transparent layer, the plurality of microstructures have a microstructure pattern,
   the plurality of microstructures are columnar structures having surfaces that are rotationally symmetric four times around a central axis of symmetry,
   each of the spectroscopic elements splits incident light in two-dimensional directions; and
   the plurality of pixels detect the light split in the two-dimensional directions,
   wherein spectroscopic units are adjacent to each other in two-dimensional directions, each of the spectroscopic units is composed of four spectroscopic elements in the two-dimensional spectroscopic element array, the four spectroscopic elements are adjacent to each other in the two-dimensional directions, and the spectroscopic functions of the four spectroscopic elements in the each spectroscopic unit are different from each other.

2. The image sensor according to claim 1, wherein
   the incident light is split into first deflected light, second deflected light, third deflected light, and fourth deflected light that each have a different transmission direction according to a wavelength region, and wherein
   a first pixel, a second pixel, a third pixel, and a fourth pixel that are adjacent to each other and are located below each of the spectroscopic elements respectively detect the first deflected light, the second deflected light, the third deflected light, and the fourth deflected light.

3. The image sensor according to claim 2,
   wherein the center of each of the spectroscopic elements is located directly above the center of a quadrangular shape formed by the first pixel, the second pixel, the third pixel, and the fourth pixel, which are adjacent to each other and are located directly below each of the spectroscopic elements,
   wavelength regions of the first pixel, the second pixel, the third pixel, and the fourth pixel, which are adjacent to each other, correspond to wavelength regions of the first deflected light, the second deflected light, the third deflected light, and the fourth deflected light, which are to be respectively detected by the first pixel, the second pixel, the third pixel, and the fourth pixel, and wavelength regions of at least three deflected lights among the first deflected light, the second deflected light, the third deflected light, and the fourth deflected light are different from each other.

4. The image sensor according to claim 2, wherein the plurality of microstructures in each of the spectroscopic elements have a constant thickness in a direction in which light passes through.

5. The image sensor according to claim 2, wherein the plurality of microstructures in each of the spectroscopic elements have different thicknesses in a direction in which light passes through, depending on the position.

6. The image sensor according to claim 2, wherein if the incident light is white light,
the light incident on the first pixel has a light intensity peak in a blue wavelength region of wavelengths of 500 nm or less,
the light incident on the second pixel and the third pixel has a light intensity peak in a green wavelength region of wavelengths of 500 nm to 600 nm, and
the light incident on the fourth pixel has a light intensity peak in a red wavelength region of wavelengths of 600 nm or more.

7. The image sensor according to claim 2, wherein if the incident light is white light,
the light incident on the first pixel has a light intensity peak in a blue wavelength region of wavelengths of 500 nm or less,
the light incident on the second pixel has a light intensity peak in a green wavelength region of wavelengths of 500 nm to 600 nm,
the light incident on the third pixel has a light intensity peak in a red wavelength region of wavelengths of 600 nm to 800 nm,
the light incident on the fourth pixel has a light intensity peak in a near-infrared wavelength region of wavelengths of 800 nm or more.

8. The image sensor according to claim 6, wherein a filter array is further included between the two-dimensional pixel array and the two-dimensional spectroscopic element array, and the filter array includes at least one of
a first filter having a transmittance peak in a blue wavelength region of wavelengths of 500 nm or less,
a second filter having a transmittance peak in a green wavelength region of wavelengths of 500 nm to 600 nm,
a third filter having a transmittance peak in a red wavelength region of wavelengths of 600 nm to 800 nm, and
a fourth filter having a transmittance peak in a near-infrared wavelength region of wavelengths of 800 nm or more.

9. An image capture apparatus comprising:
the image sensor according to claim 1;
an image capture optical system for forming an optical image on an image capture plane of the image sensor; and
a signal processing unit configured to process an electrical signal output by the image sensor.

10. A two-dimensional spectroscopic element array in which a plurality of spectroscopic elements are arranged in the form of an array inside or on a transparent layer, wherein
each of the spectroscopic elements includes a plurality of microstructures made of a material having a higher refractive index than a refractive index of the transparent layer, the plurality of microstructures have a microstructure pattern, wherein the plurality of microstructures are columnar structures having surfaces that are rotationally symmetric four times around a central axis of symmetry, and each of the spectroscopic elements splits incident light in two-dimensional directions,
wherein spectroscopic units are adjacent to each other in two-dimensional directions, each of the spectroscopic units is composed of four spectroscopic elements in the two-dimensional spectroscopic element array, the four spectroscopic elements are adjacent to each other in the two-dimensional directions, and the spectroscopic functions of the four spectroscopic elements in the each spectroscopic unit are different from each other.

* * * * *